(12) United States Patent  (10) Patent No.: US 8,786,282 B2
Scholl                    (45) Date of Patent:     Jul. 22, 2014

(54) METHOD TO CONTROL A MAGNETIC RESONANCE DEVICE FOR IMAGE ACQUISITION, AND CORRESPONDING MAGNETIC RESONANCE DEVICE

(75) Inventor: Stefan Scholl, Nuremberg (DE)

(73) Assignee: Siemens Aktiengesellschaft, Munich (DE)

( * ) Notice: Subject to any disclaimer, the term of this patent is extended or adjusted under 35 U.S.C. 154(b) by 359 days.

(21) Appl. No.: 13/227,045

(22) Filed: Sep. 7, 2011

(65) Prior Publication Data

US 2012/0056622 A1    Mar. 8, 2012

(30) Foreign Application Priority Data

Sep. 8, 2010  (DE) .......................... 10 2010 040 402

(51) Int. Cl.
*G01V 3/00*     (2006.01)
(52) U.S. Cl.
USPC .......................................... 324/314; 324/312
(58) Field of Classification Search
USPC .................. 324/309, 307, 312, 314, 300, 306
See application file for complete search history.

(56) References Cited

U.S. PATENT DOCUMENTS

| | | | |
|---|---|---|---|
| 5,438,263 A * | 8/1995 | Dworkin et al. | 324/309 |
| 6,275,035 B1 * | 8/2001 | Debbins et al. | 324/307 |
| 6,301,497 B1 * | 10/2001 | Neustadter | 600/410 |
| 6,828,787 B2 | 12/2004 | Oesingmann | |
| 6,919,721 B2 | 7/2005 | Böttcher et al. | |
| 6,982,554 B2 * | 1/2006 | Kurpad et al. | 324/318 |
| 7,319,784 B2 | 1/2008 | Ryner et al. | |

OTHER PUBLICATIONS

"Curved Slice Imaging," Börnert et al., Magnetic Resonance in Medicine, vol. 36 (1996), pp. 932-939.
"Automatic Determination of the Imaging plane in Lumbar MRI," Masaki et al., Proc. of SPIE, vol. 6144, 61443X (2006), pp. 61443X-1- 61443X-8.

* cited by examiner

*Primary Examiner* — Louis Arana
(74) *Attorney, Agent, or Firm* — Schiff Hardin LLP

(57) ABSTRACT

In a method to control a magnetic resonance device for image acquisition in at least one slice, the magnetic resonance device has a radio-frequency antenna with multiple transmission channels. At least one slice deviates from a cuboid shape and/or that is roughly adapted to a target volume of interest that is to be acquired, and/or at least one saturation volume adapted to a shape in a subject to be acquired, are defined automatically and/or manually via a user interface. The selection of possible slices and/or saturation volumes is limited automatically under consideration of the technical embodiment of the radio-frequency antenna. The image acquisition takes place in the selected slice and/or under consideration of the saturation volume.

11 Claims, 4 Drawing Sheets

METHOD TO CONTROL A MAGNETIC RESONANCE DEVICE FOR IMAGE ACQUISITION, AND CORRESPONDING MAGNETIC RESONANCE DEVICE

BACKGROUND OF THE INVENTION

1. Field of the Invention

The invention concerns a method to control a magnetic resonance device for image acquisition in at least one slice, wherein the magnetic resonance device has a radio-frequency antenna with multiple transmission channels, as well as an associated magnetic resonance device.

2. Description of the Prior Art

In magnetic resonance devices known today, the target volumes to be examined are excited in two-dimensional or three-dimensional slices. To define such slices to be acquired, graphical slice positioning systems (GSP) are known in which a user implements a positioning of a linear slice or a linear volume on an overview image, for example a localizer.

The target volumes—for example organs or defined tissue—are normally nonlinear, such that either the acquired image extends beyond the appertaining target volume or a portion of the target volume cannot be acquired.

In addition to the definition of such slices, within the framework of a graphical slice positioning it can also be possible to define a saturation volume in the acquisition region. There the nuclear spins are saturated in advance by defined excitation pulses, such that factors interfering with the image acquisition—for example movement, susceptibility or flow artifacts—can be suppressed. Such saturation volumes are also selected as linear volumes, wherein in this case it is also to be established that the regions to be suppressed are frequently not linearly bounded.

To solve this problem it is known to define a larger number of slices or saturation volumes in order to be able to cover the target volume or the region to be suppressed with certainty. In the individual case it is also known to make a special selection of image acquisition parameters, for example to specifically select phase direction in order to suppress flow artifacts.

SUMMARY OF THE INVENTION

An object of the invention is to provide a method with which it is possible in a simplified manner to safely acquire the entire target volume or, respectively, to safely suppress an entire region to be suppressed, wherein optimally few superfluous data/excitations are obtained.

This object is achieved by a method of the aforementioned type wherein, according to the invention, at least one slice that deviates from a cuboid shape and/or that is roughly adapted to a target volume of interest that is to be acquired, and/or at least one saturation volume adapted to a shape in a subject to be acquired, are defined automatically and/or manually via a user interface, wherein the selection of possible slices and/or saturation volumes is limited automatically dependent on the technical embodiment of the radio-frequency antenna, so that the image acquisition takes place in the selected slice and/or under consideration of the saturation volume.

In accordance with the invention through the possibility of parallel transmission in a corresponding hardware/software expansion of a magnetic resonance device, curved excitations can be achieved during a magnetic resonance measurement. In parallel transmission, a radio-frequency antenna is provided that has multiple antenna elements that can be activated separately (thus via different transmission channels), and consequently enables a larger number of degrees of freedom in the excitation of nuclear spins in a defined frame. The actual existing possibilities to provide curved excitations or precisely spatially defined excitations result from the technical embodiment of the radio-frequency antenna, such that these can be determined and graphical slice positioning can be done dependent on the technical possibilities of the magnetic resonance device. The method also allows slices and saturation volumes with curved boundaries to be realized accordingly in the activation.

The invention encompasses a user interface for graphical slice positioning, this user interface being adapted to the concrete technical conditions in the magnetic resonance device, and the user interface allows curved excitation and saturation slices so that the image acquisition can be implemented more quickly, efficiently and qualitatively better using these curved slices/saturation volumes.

Calibration measurements and/or simulations that can deliver the necessary information matched to the concrete magnetic resonance device can naturally be used in order to determine the possibilities of curved excitations for the specific hardware that is present (thus in particular the radio-frequency antenna and/or a transmission unit providing the transmission channels), in order to be able to automatically limit the selection of possible slices and/or saturation volumes under consideration of the technical embodiment of the radio-frequency antenna.

In an embodiment of the present invention the target volume is segmented automatically and/or semi-automatically in an overview image acquired in advance, in particular a localizer. An automatic and/or at least semi-automatic image segmentation with regard to the target volume and/or the saturation volume can be implemented based on an overview image, in particular a localizer which can be executed two-dimensionally or three-dimensionally. An important basis for a reasonable definition of slices to be acquired and/or saturation volumes to be suppressed is therefore achieved; the excitation profiles can be oriented on this given the final definition.

Dependent on the shape of the segmented target volume, a suggestion (prompt) for at least one slice and/or one saturation volume under consideration of the technical embodiment of the radio-frequency antenna is determined automatically and displayed in the user interface. It is consequently possible that a suggestion has already been determined automatically, for example by a control device or other computer of the magnetic resonance device, this suggestion taking the specific conditions of the target volume (in particular its shape and attitude) into account in order to optimally be able to make the definition regarding the measurement target, in particular with regard to a complete coverage. This is particularly advantageous if the segmentation was also possible automatically, which is conceivable if which type of image acquisition to be implemented should be known to the magnetic resonance device. For example, target volumes to be examined can be input by a user at the beginning of the magnetic resonance examination. It is also possible to retrieve that information via an information system, for example a radiology information system (RIS) or a hospital information system (HIS). Furthermore, an anatomical atlas can be provided so that the rough attitude of the target volume is already known and suitable start points for a segmentation can be selected. In addition to such an automatic segmentation, it is in principle also possible that the segmentation takes place semi-automatically; for example, a user consequently establishes a start point for the segmentation or the like. Immediately following the segmentation, under consideration of the possibilities of the radio-frequency antenna the target volume can then be analyzed automatically as to how an optimal excitation is achieved.

The type of proposed measurement also can be taken into account in the determination of the suggestion. For example, specific basic geometries of usable slices can be predetermined that yield specific advantages in the evaluation for specific measurements. For example, given a measurement with administration of a contrast agent it can thus be provided that the slice volume is filled by "concentric" (thus interleaved) slices so that how the contrast agent is externally distributed radially and the like can be observed from a starting point, for example. Using curved slices, new possibilities are clearly provided that enable an improved and targeted evaluation of the acquired images.

Completely filled slices that contain the target volumes of interest can be suggested. In this embodiment the suggestion is presented that the entire target volume can ideally be acquired efficiently using technically possible slices without too many additional image data being acquired in regions surrounding the target volume. For example, in principle slices with longitudinal areas running in parallel can be defined that then have curved boundaries that are adapted to the target volume.

A segmentation algorithm can be adapted to the target volume can be selected and used. Multiple existing segmentation algorithms can be displayed in a modular fashion to a user who can then select these, it is also possible to make an automatic selection of segmentation algorithms matched to the concrete magnetic resonance examination to be conducted, in particular within the scope of an automatic segmentation. The segmentation algorithms can be adopted from existing routines, which for example are optimized for specific body regions and/or organs (for example the head, the heart or arteries). As a result of the segmentation step to be implemented the target volume (often designated as a region of interest, ROI) is limited to the remaining image information of the overview image.

At least one tool for user-controlled variation of the slice and/or of the saturation volume is indicated in the user interface. In particular in the case of a suggestion that was determined automatically, but also given slices/saturation volumes defined by a user, the possibility is offered to better adapt the slices to the pending image acquisition as necessary. For example, additional manipulators can be provided at the slices so that these can be adapted irregularly to the boundary regions as needed. However, it can also be provided that at least one tool is used for selection of a basic slice shape and/or slice arrangement. For example, a basic shape can be selected, for example interleaved slices growing larger as they extend outward; parallel slices filling the target volume; and the like. Naturally, additional tools are also conceivable that enable a user to be able to manipulate and adapt the slices according to his desires and requirements.

As mentioned, the image acquisition finally takes place in the selected slice and/or under consideration of the saturation volume. For this it can be concretely provided that a sequence calculation unit determines activation parameters (in particular for the radio-frequency antenna) under consideration of the defined slice and/or the defined activation volume, in particular for the radio-frequency antenna, wherein the components of the magnetic resonance device are then activated with these activation parameters during the image acquisition. The selected, curved slices/saturation volumes are consequently relayed to the sequence calculation unit of the magnetic resonance unit and there are transformed into a corresponding excitation profile, which is possible since the technical possibilities of the radio-frequency antenna or, respectively, other components of the magnetic resonance device are also accounted for to a limited extent in the definition of the slice and/or of the saturation volume.

In a further embodiment of the present invention, it can be provided that in the following an image acquired in a slice is displayed simultaneously with a presentation indicating the attitude of the slice in the target volume. The defined slices are consequently stored so that their attitude in the later survey of the acquired images (concretely the acquired slices) can be indicated simultaneously with the planning image, in that the attitude of the slice is indicated, in particular is emphasized. It is thus possible that the planned slices are shown as a reference in the result images so that an excellent orientation is provided to the user.

In addition to the method, the present invention also concerns a magnetic resonance device with a control device fashioned to implement the method according to the invention.

The statements above with regard to the method according to the invention apply analogously to the magnetic resonance device according to the invention.

The magnetic resonance device also encompasses a sequence calculation unit that determines activation parameters (in particular for the radio-frequency antenna) from defined slices and/or defined activation volumes.

DESCRIPTION OF THE PREFERRED EMBODIMENTS

Figure 1:
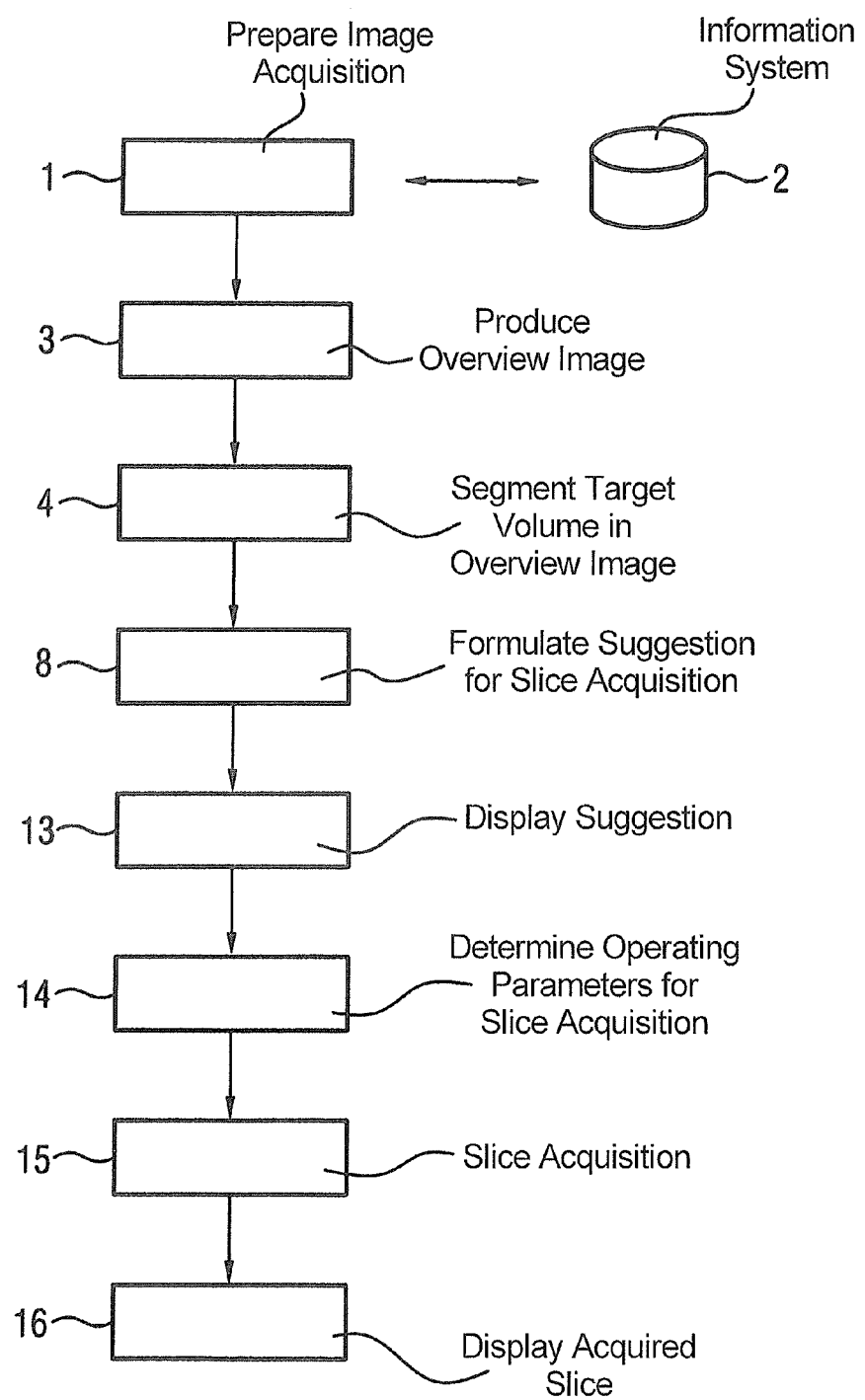
FIG. 1 is a flowchart of an exemplary embodiment of the method according to the invention.

FIG. 1 shows steps of an exemplary embodiment of the method according to the invention in the form of a flowchart. This serves to allow a definition of slices or saturation volumes to be acquired to be curved, under consideration of the technical conditions of a magnetic resonance device, and to enable a fast, efficient and qualitatively high-grade image acquisition via a corresponding activation of the magnetic resonance device.

In Step 1 the image acquisition is prepared. Just like the desired target volume, the type of image acquisition is hereby specified by a user or is also queried from an information system 2, for example a radiological information system.

In Step 3 an overview image is subsequently produced, for example a two-dimensional or three-dimensional localizer that in particular shows the region around the desired target volume.

A segmentation of the target volume at the image data of the overview image then takes place in Step 4. This can occur both wholly automatically, for example by querying the rough attitude of the target volume as a start point from an anatomical atlas. It is also possible to produce this semi-automatically or (less preferably) wholly manually. A segmentation algorithm is thereby selected that is specifically optimized for the target volume, which likewise can occur either automatically or via manual selection, for example from a list.

Figure 2:
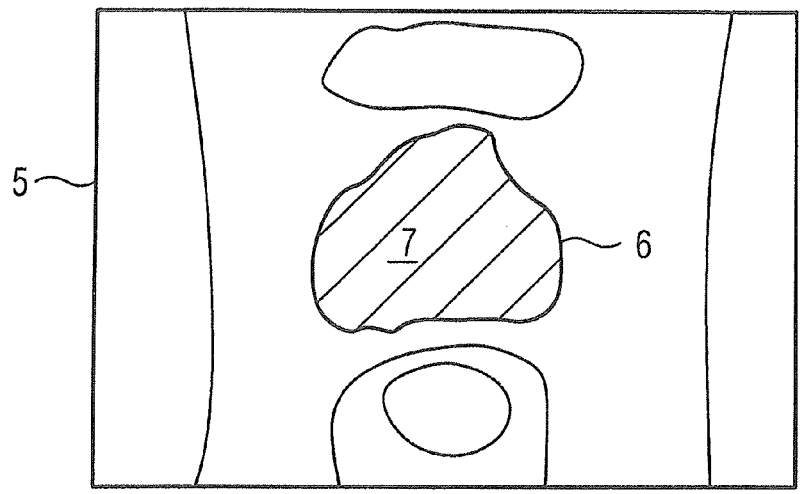
FIG. 2 schematically illustrates an overview image obtained in accordance with the invention, with a segmented target volume.

An example of such an overview image 5 is schematically illustrated in FIG. 2. The boundary 6 of the target volume 7 (for example of the prostate) was determined by the segmentation algorithm. By means of multiple two-dimensional overview images or a three-dimensional overview image it is consequently possible in this way to determine the entire attitude and shape of the target volume 7.

This information, together with the type of image acquisition, is now used in Step 8 in order to determine a suggestion for at least one slice to be acquired.

Curved slices are also possible without difficulties since the magnetic resonance device comprises a radio-frequency antenna comprising multiple transmission channels that also allows curved excitation profiles. The specific embodiment of the radio-frequency antenna (and possibly other parts of the magnetic resonance device) is taken into account in the formulation of the suggestion in Step 8, such that only those slices that can also actually be acquired with the magnetic resonance device can enter into the suggestion. In other words, not only is a suggestion matched to the shape of the target volume 7 (preferably determined automatically) and the type of the image acquisition determined; rather, the concrete technical conditions of the magnetic resonance device are also taken into account for the suggestion.

Figure 3:
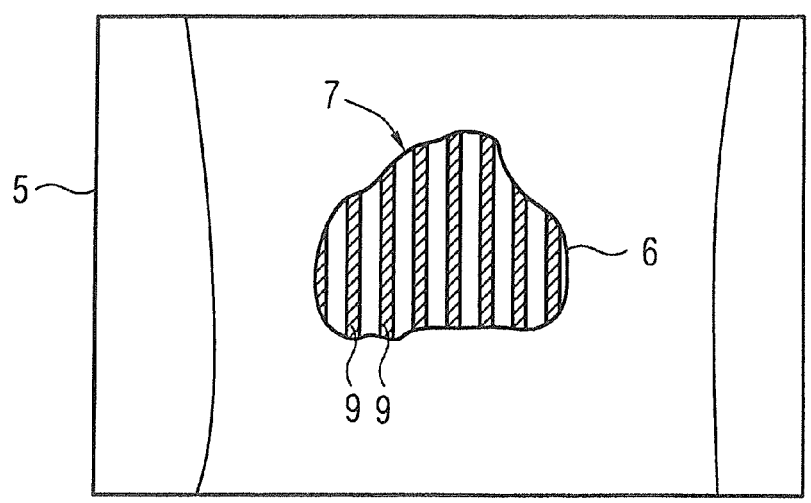
FIG. 3 illustrates an embodiment for slice selection in accordance with the invention.

FIG. 3 shows a first exemplary possibility of a suggestion, wherein parallel slices 9 are used there whose shape is adapted so that they exactly fill the target volume 7. In spite of the basic parallelism of the slices 9, these have curved boundaries following the border 6 of the target volume 7. Only exactly the target volume is acquired in this way; surrounding areas consequently no longer have to be acquired as well.

Figure 4:
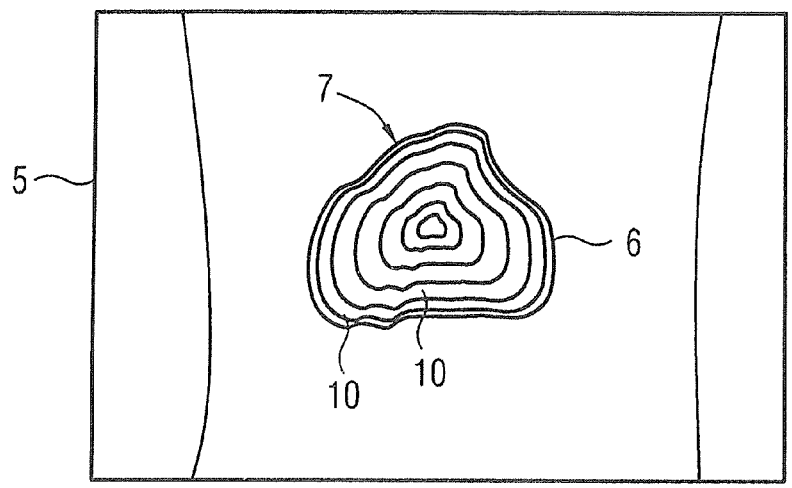
FIG. 4 illustrates a further embodiment for slice selection in accordance with the invention.

An additional example which can be applied particularly well in the case of image acquisitions in which a contrast agent should be tracked is shown in FIG. 4. Curved slices oriented on the border 6 are suggested there that are arranged interleaved, for example such that a contrast agent flow beginning in the middle of the target volume 7 can advantageously tracked in its outward propagation.

Depending on the application case, other types of curved slices are naturally also conceivable in order to suitable acquire the target volume for a specific image acquisition.

Figure 5:
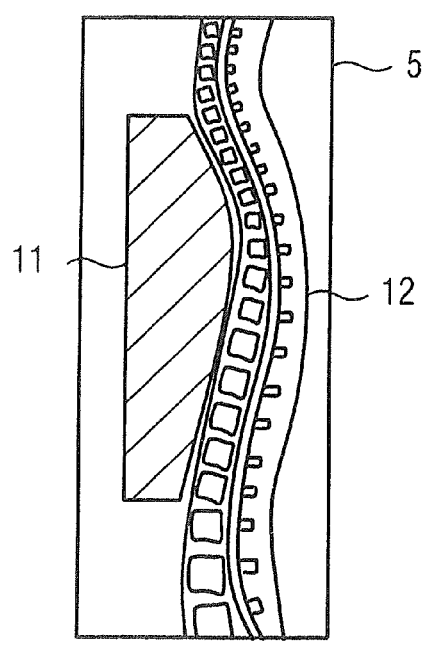
FIG. 5 schematically illustrates an embodiment of a curved saturation volume in accordance with the invention.

The method according to the invention is fashioned for the definition not only of target volumes under consideration of the concrete embodiment of the magnetic resonance device, but rather also of saturation volumes for which a suggestion can moreover likewise be formulated using a segmentation of the target volume, for example when a saturation volume surrounding the target volume is required. FIG. 5 shows an example of a saturation volume 11 with a curved surface for the case of a spinal column 12 as a target volume. The saturation volume 11 can clearly be adapted to the curve of the spinal column 12. The definition of saturation volumes with curved surface is consequently also possible on the one hand depending on the target volume and additional parameters of the image acquisition, on the other hand under consideration of the technical possibilities of the radio-frequency antenna.

In Step 13 the corresponding suggestion is displayed to a user in a user interface. The user can then accept the suggestion or also use tools in order to be able to further adapt the slices within the scope of the technical possibilities. For example, manipulators as they are known from other graphical user interfaces can be used for this in order to be able to adapt slices (in terms of their size, attitude, shape, extent and the like) according to the preference of a user. In particular, a tool can be provided with which different basic shapes or, respectively, basic configurations of slices can be switched between, for example between the basic slice shapes/arrangements shown for slices 9 and 10. Naturally, this analogously applies for the definitions of saturation volumes.

If the user is then satisfied, at the conclusion of Step 13 he confirms his selection and the method proceeds with Step S14. The slices and/or the saturation volume are therein transferred to a sequence calculation unit that, given consideration of the defined slices and/or the defined activation volume, determines activation parameters for magnetic resonance devices, in particular an excitation profile for the radio-frequency antenna that then is applied to the image acquisition corresponding to the transmission channels of the radio-frequency coil (and possible other components of the magnetic resonance device) in order to achieve the saturation in the saturation volume and/or the image acquisition in precisely the selected slices.

This image acquisition takes place in Step 15.

Figure 6:
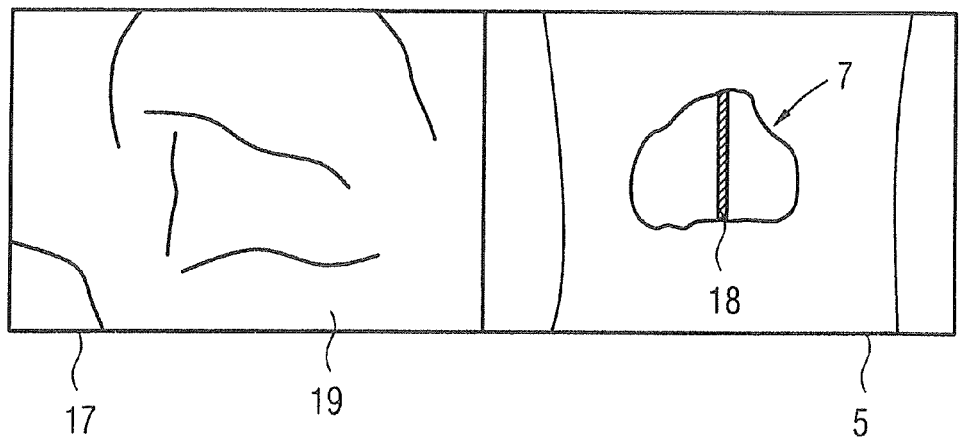
FIG. 6 schematically illustrates an embodiment of a presentation of the acquired image together with the slice, in accordance with the invention.

The images acquired in the slices can then be displayed to a user in Step 16. A possible presentation 17 is shown in FIG. 6. For example, the image acquired in a specific slice 18 is shown there, for example in a corresponding window on the left side. The overview image 5—possibly also with the shown target volume 7—is shown to the right in the depiction. There the slice 18 is now shown with clear emphasis in terms of its attitude, such that an excellent result is oriented for the user.

Figure 7:
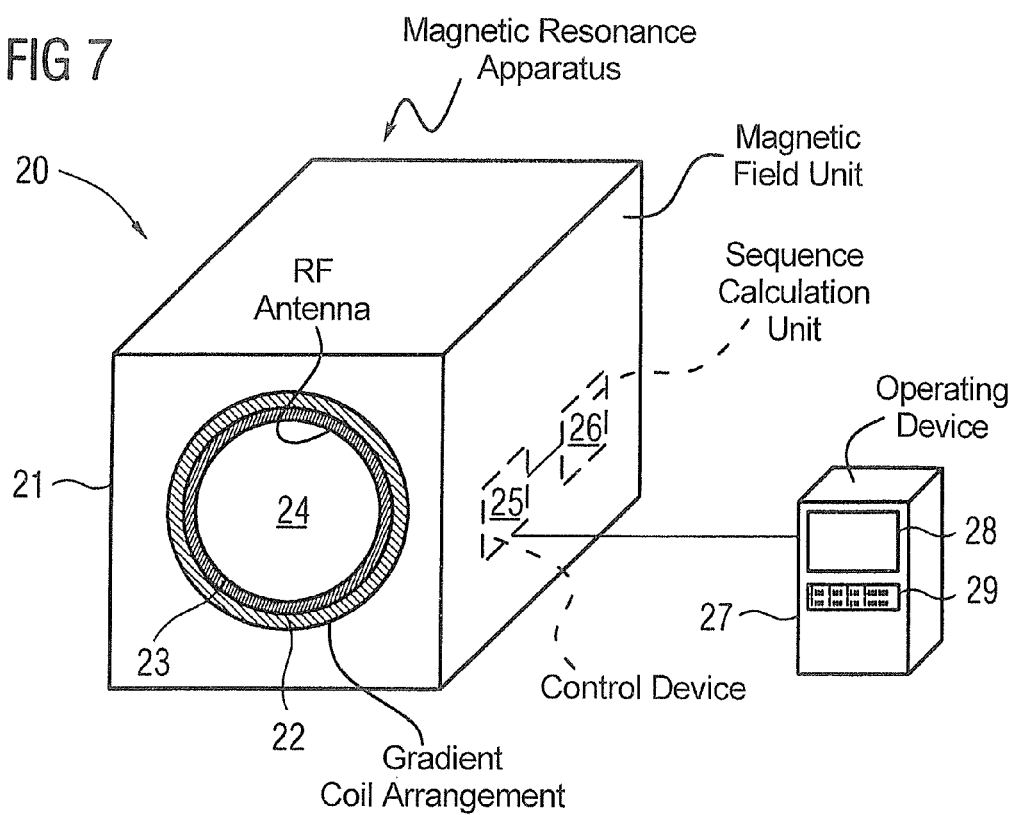
FIG. 7 schematically illustrates a magnetic resonance apparatus constructed and operating in accordance with the present invention.

Finally, FIG. 7 shows a principle drawing of a magnetic resonance device 20 according to the invention. As is known, this has a basic magnetic field unit 21 that has a bore in which (as is known) a gradient coil arrangement 22 and a radio-frequency antenna 23 are arranged so that ultimately a patient receptacle 24 is defined into which a patient bed (not shown in detail here) can be driven.

The radio-frequency antenna 23 is fashioned for parallel transmission, which means that it comprises multiple antenna elements that can be activated independently (for example individual conductor loops) such that multiple transmission channels are possible. In principle it is thus possible to a certain extent to realize curved excitation profiles in that the different transmission channels are used.

The operation of the magnetic resonance device 20 controls a control device 25 that is fashioned to implement the method according to the invention. For this the control device 25 is connected with a sequence calculation unit 26, wherein the sequence calculation unit 26 can also be integrated into the control device 25.

An operating device 27 is also provided that comprises a display device 28 (for example a monitor) and an input device 29 so that the user interface can be presented and inputs by a user can also be received.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method to operate a magnetic resonance data acquisition device having a radio-frequency (RF) antenna comprising multiple transmission channels that are each individually operable to radiate RF energy, said RF antenna comprising antenna hardware having inherent operating limitations, said method comprising:

via a user interface of a control unit for said magnetic resonance data acquisition device, designating at least one image acquisition item selected from the group consisting of a slice having a non-cuboid shape from which image data are to be acquired, a slice having a shape adapted to a target volume from which image data are to be acquired, and a saturation volume adapted in shape to a target volume from which image data are to be acquired;

in a processor in said control unit, automatically limiting the designated image acquisition item, designated via said user interface, dependent on said antenna hardware of said RF antenna, to produce an antenna-limited image acquisition item from which said image data can be acquired without exceeding said operating limitations of said antenna hardware;

in said processor, automatically determining, from said antenna-limited image acquisition item, a protocol for operating said magnetic resonance data acquisition unit to acquire said image data by determining individual operating parameters for the respective transmission channels of said RF antenna that cause RF energy to be radiated from said individual transmission channels to acquire said image data without exceeding said operating limitations of said antenna hardware, and embodying said operating parameters for said individual transmission channels in said protocol; and said control unit as an electronic signal having a format for making said protocol available at an output of said magnetic resonance data acquisition unit to acquire said image data according to said protocol.

2. A method as claimed in claim 1 comprising:
providing a localizer image of the subject that contains the target volume; and
in said processor, segmenting the target volume in said localizer image.

3. A method as claimed in claim 2 comprising in said processor, generating a suggestion for said antenna-limited image acquisition item using the segmented target volume and said technical embodiment of the radio-frequency antenna and the designated image acquisition item, and presenting said suggestion at a display of the user interface.

4. A method as claimed in claim 3 comprising limiting the designated image acquisition item also dependent on a type of an acquisition procedure to be implemented to acquire said image data.

5. A method as claimed in claim 3 wherein said designated image acquisition item is a slice, and comprising, in said processor, limiting said slice by suggesting filtered slices for said target volume.

6. A method as claimed in claim 3 comprising, for segmenting the target volume, using a segmentation algorithm that is adapted to said target volume.

7. A method as claimed in claim 1 comprising, in said processor, automatically generating a tool for manually limiting the designated image acquisition item in order to produce the antenna-limited image acquisition item, and displaying said tool at a display of the user interface.

8. A method as claimed in claim 7 comprising generating said tool to allow selection of a shape of said designated image acquisition item.

9. A method as claimed in claim 1 comprising, in a sequence calculation unit in said control unit, calculating pulse activation parameters dependent on said antenna-limited image acquisition item, and incorporating said parameters in said protocol.

10. A method as claimed in claim 1 comprising displaying, at a display of said user interface, a slice acquired with said magnetic resonance data acquisition unit operated according to said protocol, together with an indication of an orientation of said slice relative to said target volume.

11. A magnetic resonance system comprising:

a magnetic resonance data acquisition device having a radio-frequency (RF) antenna comprising multiple transmission channels that are each individually operable to radiate RF energy, said RF antenna comprising antenna hardware having inherent operating limitations;

a control unit having a user interface and a processor;

said user interface of said control unit being configured to allow designation of at least one image acquisition item selected from the group consisting of a slice having a non-cuboid shape from which image data are to be acquired, a slice having a shape adapted to a target volume from which image data are to be acquired, and a saturation volume adapted in shape to a target volume from which image data are to be acquired;

said processor in said control unit being configured to automatically limit the designated image acquisition item, designated via the user interface, dependent on said antenna hardware of said RF antenna, to produce an antenna-limited image acquisition item from which said image data can be acquired without exceeding said operating limitations of said antenna hardware;

said processor being configured to automatically determine, from said antenna-limited image acquisition item, a protocol for operating said magnetic resonance data acquisition unit to acquire said image data by determining individual operating parameters for the respective transmission channels of said RF antenna that cause RF energy to be radiated from said individual transmission channels to acquire said image data without exceeding said operating limitations of said antenna hardware, and to embody said operating parameters for said individual transmission channels in said protocol; and said control unit being configured to make said protocol available at an output of the control unit as an electronic signal having a format for operating said magnetic resonance data acquisition unit to acquire said image data according to said protocol.

* * * * *